(12) United States Patent
Cao et al.

(10) Patent No.: US 10,312,335 B2
(45) Date of Patent: Jun. 4, 2019

(54) GATE WITH SELF-ALIGNED LEDGE FOR ENHANCEMENT MODE GAN TRANSISTORS

(71) Applicant: Efficient Power Conversion Corporation, El Segundo, CA (US)

(72) Inventors: Jianjun Cao, Torrance, CA (US); Alexander Lidow, Santa Monica, CA (US); Alana Nakata, Redondo Beach, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 15/655,438

(22) Filed: Jul. 20, 2017

(65) Prior Publication Data

US 2017/0317179 A1    Nov. 2, 2017

Related U.S. Application Data

(60) Division of application No. 14/447,069, filed on Jul. 30, 2014, now Pat. No. 9,748,347, which is a
(Continued)

(51) Int. Cl.
*H01L 29/423* (2006.01)
*H01L 21/283* (2006.01)
(Continued)

(52) U.S. Cl.
CPC ...... *H01L 29/42316* (2013.01); *H01L 21/283* (2013.01); *H01L 21/28587* (2013.01); *H01L 29/1066* (2013.01); *H01L 29/2003* (2013.01); *H01L 29/205* (2013.01); *H01L 29/66462* (2013.01); *H01L 29/7786* (2013.01)

(58) Field of Classification Search
CPC ..................... H01L 29/42316; H01L 21/283
See application file for complete search history.

(56) References Cited

U.S. PATENT DOCUMENTS

| 6,730,552 B1 | 5/2004 | Abadeer et al. |
| 7,939,880 B2 | 5/2011 | Kang et al. |

(Continued)

FOREIGN PATENT DOCUMENTS

| JP | 2011-142182 A | 7/2011 |
| TW | 201232779 | 8/2012 |
| TW | 201314898 | 4/2013 |

*Primary Examiner* — Jamie C Niesz
(74) *Attorney, Agent, or Firm* — Blank Rome LLP

(57) ABSTRACT

An enhancement-mode GaN transistor with reduced gate leakage current between a gate contact and a 2DEG region and a method for manufacturing the same. The enhancement-mode GaN transistor including a GaN layer, a barrier layer disposed on the GaN layer with a 2DEG region formed at an interface between the GaN layer and the barrier layer, and source contact and drain contacts disposed on the barrier layer. The GaN transistor further includes a p-type gate material formed above the barrier layer and between the source and drain contacts and a gate metal disposed on the p-type gate material, with wherein the p-type gate material including comprises a pair of self-aligned ledges that extend toward the source contact and drain contact, respectively.

7 Claims, 6 Drawing Sheets

Related U.S. Application Data continuation-in-part of application No. 13/838,792, filed on Mar. 15, 2013, now Pat. No. 8,890,168, which is a division of application No. 12/756,960, filed on Apr. 8, 2010, now Pat. No. 8,404,508.

(60) Provisional application No. 61/167,777, filed on Apr. 8, 2009, provisional application No. 61/860,976, filed on Aug. 1, 2013.

(51) Int. Cl.
*H01L 29/66* (2006.01)
*H01L 29/778* (2006.01)
*H01L 29/10* (2006.01)
*H01L 29/20* (2006.01)
*H01L 21/285* (2006.01)
*H01L 29/205* (2006.01)

(56) References Cited

U.S. PATENT DOCUMENTS

| | | | |
|---|---|---|---|
| 2004/0119110 A1* | 6/2004 | Park | H01L 21/28273 257/315 |
| 2006/0157735 A1* | 7/2006 | Kanamura | H01L 29/42316 257/194 |
| 2006/0273347 A1* | 12/2006 | Hikita | H01L 29/66462 257/192 |
| 2009/0004872 A1 | 1/2009 | Okamoto | |
| 2009/0072272 A1* | 3/2009 | Suh | H01L 29/1066 257/194 |
| 2010/0258843 A1* | 10/2010 | Lidow | H01L 29/1066 257/192 |
| 2013/0168743 A1 | 7/2013 | Dove | |

* cited by examiner

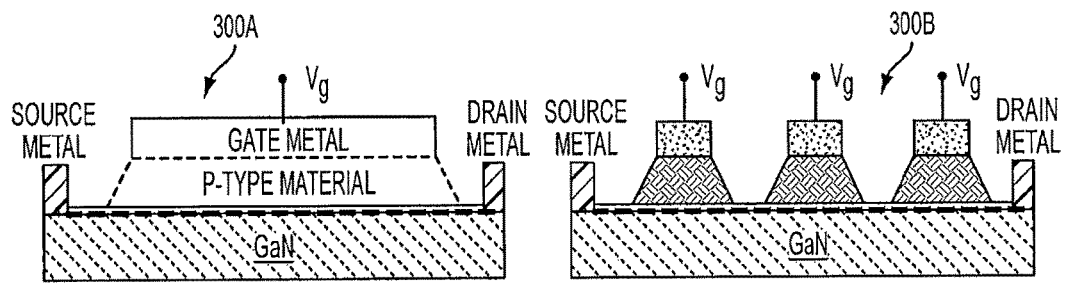
FIG. 3A
PRIOR ART
FIG. 3B
PRIOR ART
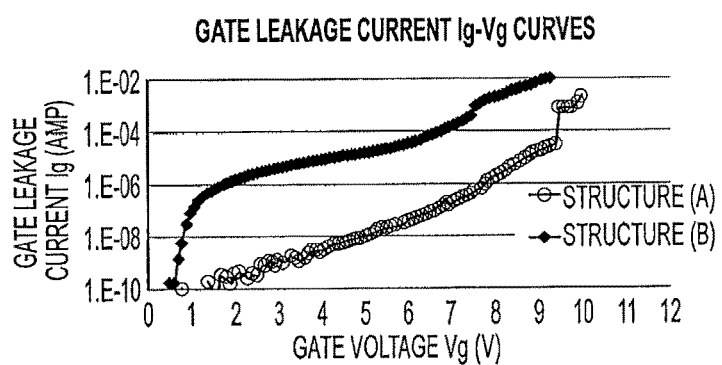
FIG. 4
PRIOR ART

GATE WITH SELF-ALIGNED LEDGE FOR ENHANCEMENT MODE GAN TRANSISTORS

CROSS REFERENCE TO RELATED APPLICATIONS

This application is a divisional of U.S. patent application Ser. No. 14/447,069, filed Jul. 30, 2014, which is a continuation-in-part of U.S. patent application Ser. No. 13/838,792, filed Mar. 15, 2013, now U.S. Pat. No. 8,890,168, which is a divisional of U.S. patent application Ser. No. 12/756,960, filed Apr. 8, 2010, now U.S. Pat. No. 8,404,508, which claims the benefit of U.S. Provisional Application No. 61/167,777, filed Apr. 8, 2009. Application Ser. No. 14/447,069 also claims the benefit of U.S. Provisional Application No. 61/860,976, filed on Aug. 1, 2013. The entire disclosures are hereby incorporated by reference in their entireties.

BACKGROUND OF THE INVENTION

1. Field of the Invention

The present invention relates generally to transistors and, more particularly, to an enhancement mode GaN transistor with reduced gate leakage current between the gate and the 2DEG region.

2. Description of the Related Art

GaN semiconductor devices are increasingly desirable because of their ability to switch at high frequency, to carry large current, and to support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET). These types of devices can typically withstand high voltages, e.g., 30V-to-2000 Volts, while operating at high frequencies, e.g., 100 kHZ-100 GHz.

A GaN HEMT device includes a nitride semiconductor with at least two nitride layers. Different materials formed on the semiconductor or on a buffer layer cause the layers to have different band gaps. The different material in the adjacent nitride layers also causes polarization, which contributes to a conductive two dimensional electron gas (2DEG) region near the junction of the two layers, specifically in the layer with the narrower band gap.

The nitride layers that cause polarization typically include a barrier layer of AlGaN adjacent to a layer of GaN to include the 2DEG, which allows charge to flow through the device. This barrier layer may be doped or undoped. Because the 2DEG region exists under the gate at zero gate bias, most nitride devices are normally on, or depletion mode devices. If the 2DEG region is depleted (i.e., removed) below the gate at zero applied gate bias, the device can be an enhancement mode device. Enhancement mode devices are normally off and are desirable because of the added safety they provide and because they are easier to control with simple, low cost drive circuits. An enhancement mode device requires a positive bias applied at the gate in order to conduct current.

FIG. 1 illustrates a conventional schematic enhancement-mode GaN transistor. As shown, a p-type material 101 is used as the gate 103. At 0V bias, the p-type material 101 depletes the 2DEG 102 under the gate 103, and the device is in an OFF state. The transistor is turned ON by applying a positive voltage to the gate 103. FIG. 2 illustrates a schematic diagram of two gate leakage current paths 201, 202 of a conventional enhancement-mode GaN transistor. The first gate leakage current path 201 flows along the sidewall of the p-type gate material 101 and the second gate leakage current path 202 flows through the bulk of the p-type gate material 101.

FIGS. 3A and 3B illustrate schematic diagrams of two test structures 300A, 300B designed to determine the types of structures for an enhancement-mode GaN transistor that may result in lower gate leakage current. In particular, the transistor structure 300A illustrated in FIG. 3A is designed with a larger gate surface area and fewer gate edges when compared to the transistor structure 300B illustrated in FIG. 3B. In this example, the transistor structure 300A has a gate surface area of 140,000 $\mu m^2$ and 2,500 $\mu m$ edges, while the transistor structure 300B has a gate surface area of 84,000 $\mu m^2$ and 247,000 $\mu m$ edges.

FIG. 4 illustrates a graphical comparison of the gate leakage currents of the transistor structures 300A and 300B illustrated in FIGS. 3A and 3B, respectively. As shown, structure 300B has a higher gate leakage current than structure 300A, suggesting that the gate leakage current is predominately along the gate edge, i.e., path 201 illustrated in FIG. 2.

Accordingly, it is an object of the present invention is to provide an enhancement-mode GaN transistor with reduced gate leakage current between the gate 103 and the 2DEG 102.

SUMMARY OF THE INVENTION

An enhancement-mode GaN transistor and method for manufacturing the same is disclosed herein with the enhancement-mode GaN transistor having reduced gate leakage current between a gate contact and a 2DEG region and a method for manufacturing the same. The enhancement-mode GaN transistor including a GaN layer, a barrier layer disposed on the GaN layer with a 2DEG region formed at an interface between the GaN layer and the barrier layer, and source contact and drain contacts disposed on the barrier layer. The GaN transistor further includes a p-type gate material formed above the barrier layer and between the source and drain contacts and a gate metal disposed on the p-type gate material, with wherein the p-type gate material including comprises a pair of self-aligned ledges that extend toward the source contact and drain contact, respectively.

A method for manufacturing the enhancement-mode GaN transistor disclosed herein includes the steps of forming a GaN layer; forming a barrier layer on the GaN layer; depositing a p-type gate material on the barrier layer; depositing a gate metal on the p-type gate material; forming a photoresist over the gate metal; etching the gate metal and the p-type gate material; and isotropically etching the gate metal to form pair of ledges on the p-type gate material below the gate metal.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein:

FIG. 3A illustrates a schematic diagram of test structure of an enhancement-mode GaN transistor.

FIG. 3B illustrates a schematic diagram of test structure of another enhancement-mode GaN transistor.

FIG. 4 illustrate a graphical comparison of the gate leakage currents of structures shown in FIGS. 3A and 3B.

DETAILED DESCRIPTION OF THE EXEMPLARY EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 1:
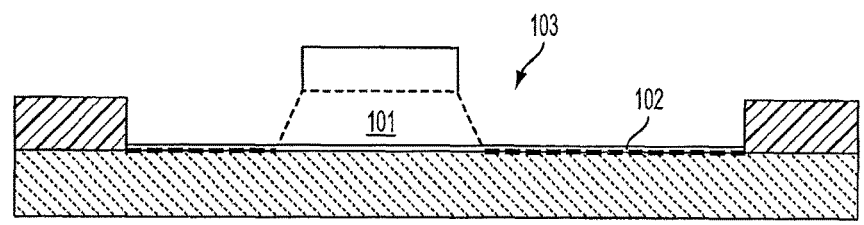
FIG. 1 illustrates a schematic of a conventional enhancement-mode GaN transistor.
Figure 2:
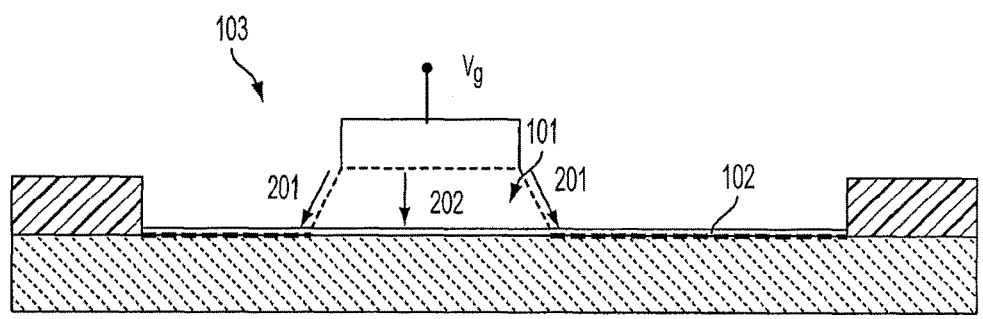
FIG. 2 illustrates a schematic diagram of two gate leakage current paths of a conventional enhancement-mode GaN transistor.
Figure 5:
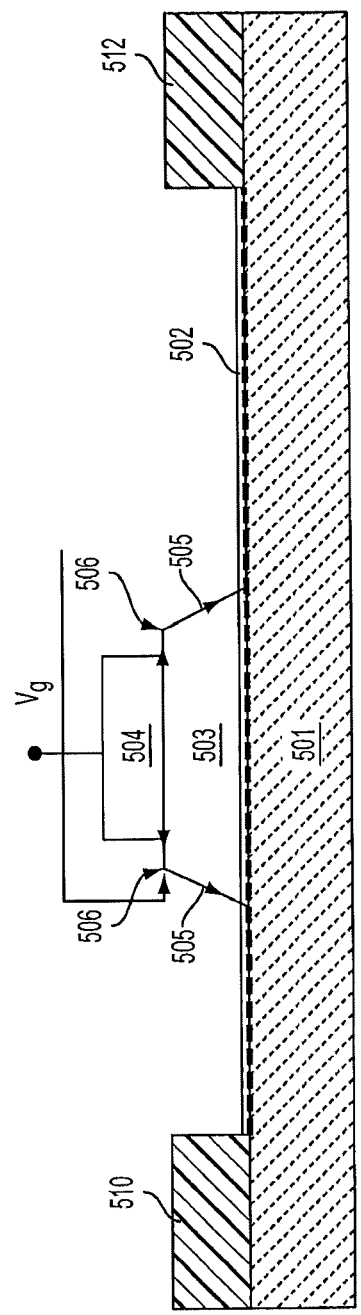
FIG. 5 illustrates a schematic diagram of a transistor device according to an exemplary embodiment of the present invention.

FIG. 5 illustrates a schematic diagram of a transistor device according to an exemplary embodiment of the present invention. As shown, the transistor includes a source metal 510 (i.e., source contact) and a drain metal 512 (i.e., drain contact) with a gate contact disposed between the source and drain metals. In particular, a GaN base layer 501 is provided with a barrier layer 502 formed over the GaN base layer 501 and a two dimensional electron gas (2DEG) region formed at the interface between the GaN base layer 501 and the barrier layer 502. In the exemplary embodiment, the barrier layer 502 is formed from aluminum gallium nitride (AlGaN).

As further shown, the gate contact includes a p-type gate material 503 formed on the barrier layer 502 and includes ledges 506 that are created by a self-aligned process at the top corners of the p-type gate material 503 as will be discussed in detail below. A gate metal 504 is disposed over the p-type gate material 503. As shown, the gate metal 504 has a smaller width (i.e., the width between sidewalls of the gate metal 504) than the width of the p-type gate material 503 (i.e., the width between side surfaces of the p-type gate material 503), effectively forming the pair of horizontal ledges 506 on each side of the gate metal 504. The pair of ledges 506 that extend past sidewalls of the gate metal 504 have equal or substantially equal widths, i.e., the respective ledges are symmetric from the respective sidewalls of the gate metal to the side surfaces of the p-type gate material, which is due to the self-aligned manufacturing process.

The primary benefits of using a self-aligned manufacturing process is to: (1) enable the creation of a p-type gate with a minimum critical dimension ("CD"), (2) lower processing cost because a second mask is not required, and (3) create ledges 506 that are symmetric to the gate metal 504 disposed on the p-type gate material. As indicated by the arrows (denoted by reference numbers 505) shown on ledges 506 and the side surfaces of the p-type gate material 503, when a positive voltage $V_g$ is applied to the gate metal 504, the gate current path 505 first travels horizontally along the upper edge of the p-type gate material 503 and, once it reaches the ledges 506, the current path 505 follows the diagonal path along the edge of the p-type gate material 503. This structure results in reduced gate leakage current as discussed below with respect to FIG. 8.

Figure 6A:
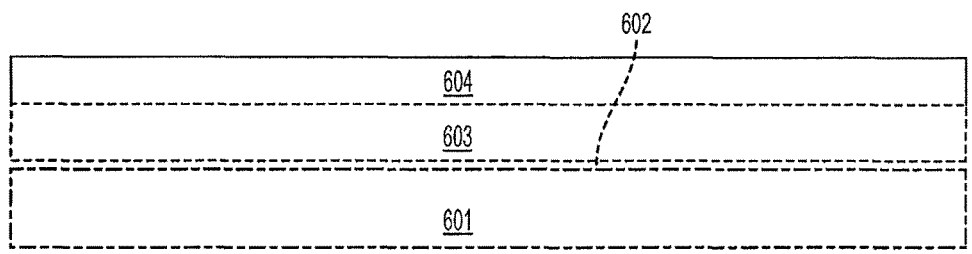
FIGS. 6A-6C illustrates a fabrication process to manufacture a gate of a transistor device with self-aligned ledges according to an exemplary embodiment.
Figure 6B:
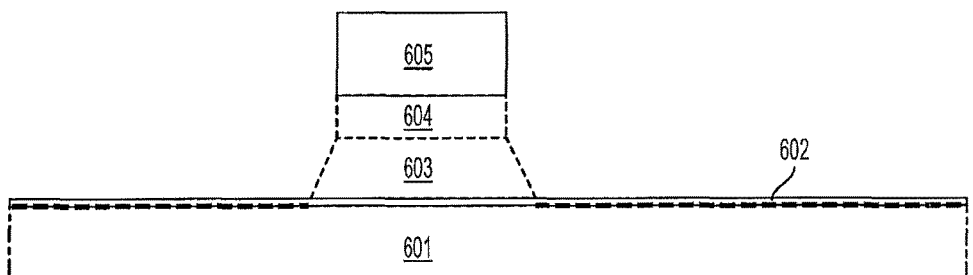
Figure 6C:
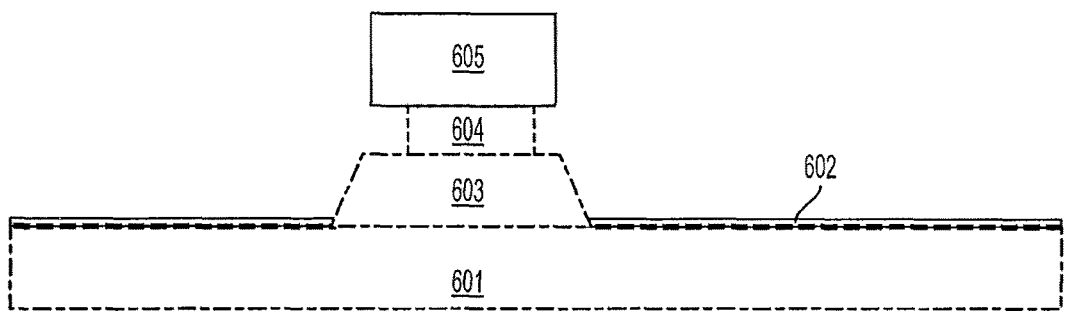

FIGS. 6A-6C illustrate a manufacturing process for fabricating a gate with self-aligned ledges in accordance with an exemplary embodiment of the present invention. As shown in FIG. 6A, the base structure of the device is first formed with a base layer 601 of gallium nitride (GaN), a barrier layer 602 of aluminum gallium nitride (AlGaN) formed on the GaN layer 601, and a layer of p-type gate material 603 formed on the barrier layer 602, over which the gate metal 604 is deposited.

Next, as shown in FIG. 6B, a photoresist 605 is deposited and the gate metal 604 is then etched. The p-type gate material 603 is also etched in a manner that results in the gate structure depicted in FIG. 6B. As shown in FIG. 6C, the gate metal 604 is then etched isotropically, which results in the gate metal have a width less than the planar upper surface of the p-type gate material 603. This second etching step results in the formation of the ledges 506 of the p-type gate material 603.

Finally, the manufacturing process includes a step of removing the photoresist 605, which is not shown, and results in the gate with self-aligned ledge shown in FIG. 5. It should also be appreciated that contact metals for the drain and source contacts can be separately deposited using conventional fabrication techniques, but their formation will not be described herein so as to not unnecessarily obscure the aspects of the invention.

Figure 7A:
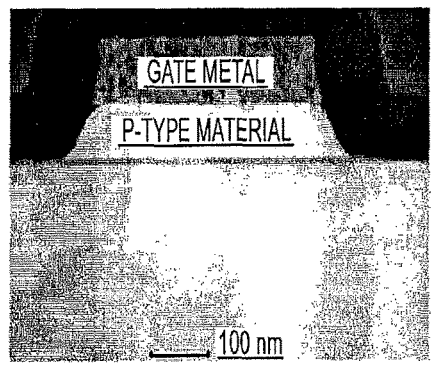
FIG. 7A illustrates a cross-sectional image of a conventional gate structure without a ledge.
Figure 7B:
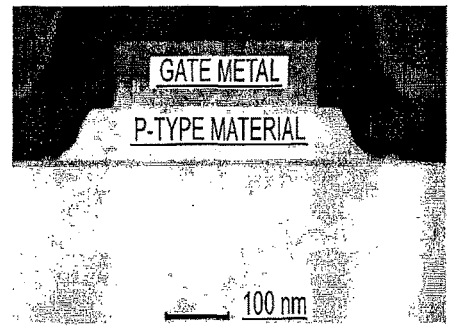
FIG. 7B illustrates a cross-sectional image of a gate structure with a self-aligned ledge according to an exemplary embodiment.
Figure 8:
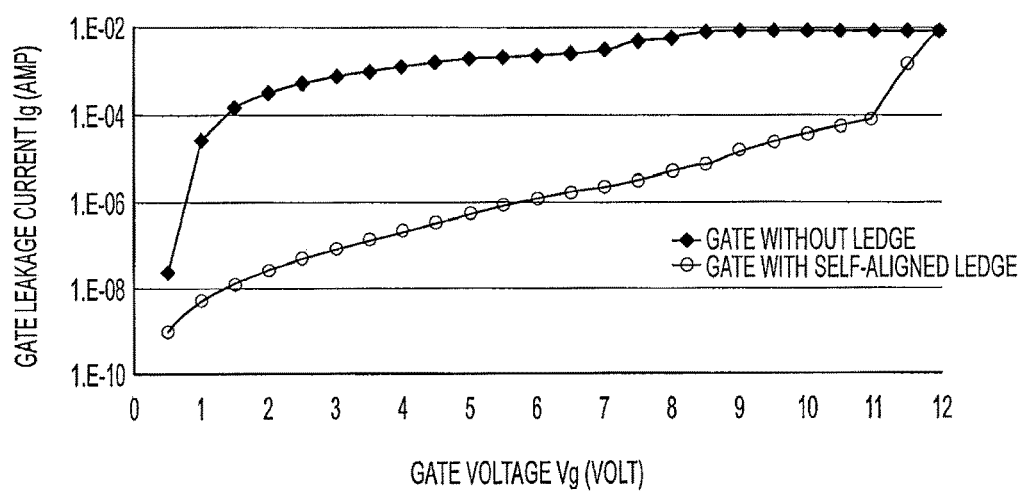
FIG. 8 illustrates a graphical comparison of gate leakage current of the gate structures illustrated in FIGS. 7A and 7B.

FIGS. 7A-7B illustrate, respectively, a transmission electron microscopy ("TEM") image of a cross-sectional view of a conventional transistor gate and an x ray of a cross-sectional view of a gate with a self-aligned ledge according to the exemplary embodiment disclosed herein. FIG. 8 illustrates a graph comparing the gate leakage current of the present invention (shown in FIG. 7B) with the gate leakage current of a conventional transistor (shown in FIG. 7A). As can be clearly seen in FIG. 8, the gate with self-aligned ledges has significantly lower gate leakage current than conventional gates without ledges when the transistor device is in the ON state.

Finally, it is noted that the self-aligned process illustrated in FIGS. 6A-6C is vastly superior to forming gate ledges using separate masks. In the process of using separate masks, a photoresist mask is applied to the unetched structure after the p-type gate material is deposited on the barrier layer of the device. In this instance, the first mask is used to pattern and etch the gate metal to a minimum CD. A second mask is then used to pattern and etch the p-type material with a wider CD than the gate metal. One significant disadvantage of this two mask process is the possibility of misalignment between the gate metal and the p-type gate material.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed:

1. An enhancement-mode GaN transistor, comprising:
   a GaN layer;
   a barrier layer disposed on the GaN layer with a 2DEG region formed at an interface between the GaN layer and the barrier layer;
   a source contact and a drain contact formed on the barrier layer;
   a p-type gate material formed above the barrier layer, the p-type gate material having side surfaces extending horizontally towards the source contact and drain contact, respectively, and contacting the barrier layer; and
   a gate metal disposed on the p-type gate material, the gate metal having sidewalls extending towards the p-type gate material,
   wherein the p-type gate material comprises a pair of horizontal ledges that extend past the respective sidewalls of the gate metal and toward the source contact and the drain contact, respectively, the pair of horizontal ledges having substantially equal widths from the sidewalls of the gate metal to the side surfaces of the p-type gate material, respectively.

2. The enhancement-mode GaN transistor according to claim 1, wherein the pair of horizontal ledges of the p-type gate material are self-aligned.

3. The enhancement-mode GaN transistor according to claim 1, wherein the barrier layer comprises aluminum gallium nitride (AlGaN).

4. The enhancement-mode GaN transistor according to claim 1, wherein the p-type gate material has a first width between the side surfaces of the p-type gate material and the gate metal has a second width between sidewalls of the gate metal, the second width being less than the first width.

5. An enhancement-mode GaN transistor, comprising:
   a GaN layer;
   a barrier layer disposed on the GaN layer with a 2DEG region formed at an interface between the GaN layer and the barrier layer;
   a source contact and a drain contact disposed on the barrier layer;
   a p-type gate material formed above the barrier layer and between the source and drain contacts;
   and a gate metal disposed on the p-type gate material,
   wherein the p-type gate material comprises: (i) a pair of self-aligned ledges that extend past sidewalls of the gate metal towards the source contact and drain contact, respectively; and (ii) side surfaces that extend horizontally towards the source contact and drain contact, respectively, and contact the barrier layer.

6. The enhancement-mode GaN transistor according to claim 5, wherein the barrier layer comprises aluminum gallium nitride (AlGaN).

7. The enhancement-mode GaN transistor according to claim 5, wherein the pair of self-aligned ledges are symmetric with respect to the gate metal.

* * * * *

(12) INTER PARTES REVIEW CERTIFICATE (4005th)

United States Patent
Cao et al.

(10) Number: US 10,312,335 K1
(45) Certificate Issued: Jul. 8, 2025

(54) GATE WITH SELF-ALIGNED LEDGE FOR ENHANCEMENT MODE GaN TRANSISTORS

(71) Applicant: Efficient Power Conversion Corporation

(72) Inventors: Jianjun Cao; Alexander Lidow; Alana Nakata

(73) Assignee: Efficient Power Conversion Corporation

Trial Number:

IPR2023-01384 filed Sep. 19, 2023

Inter Partes Review Certificate for:

Patent No.: 10,312,335
Issued: Jun. 4, 2019
Appl. No.: 15/655,438
Filed: Jul. 20, 2017

The results of IPR2023-01384 are reflected in this inter partes review certificate under 35 U.S.C. 318(b).

INTER PARTES REVIEW CERTIFICATE
U.S. Patent 10,312,335 K1
Trial No. IPR2023-01384
Certificate Issued Jul. 8, 2025

AS A RESULT OF THE INTER PARTES REVIEW PROCEEDING, IT HAS BEEN DETERMINED THAT:

Claims 1-7 are cancelled.

\* \* \* \* \*